United States Patent
Jun

(10) Patent No.: US 6,249,559 B1
(45) Date of Patent: Jun. 19, 2001

(54) DIGITAL FREQUENCY PHASE LOCKED LOOP (FPLL) FOR VESTIGIAL SIDEBAND (VSB) MODULATION TRANSMISSION SYSTEM

(75) Inventor: Jung-Sig Jun, Seoul (KR)

(73) Assignee: L.G. Electronics Inc., Seoul (KR)

( * ) Notice: Subject to any disclaimer, the term of this patent is extended or adjusted under 35 U.S.C. 154(b) by 0 days.

(21) Appl. No.: 08/702,094

(22) Filed: Aug. 23, 1996

(30) Foreign Application Priority Data

Aug. 25, 1995 (KR) ................................................. 95/26664
Jan. 5, 1996 (KR) ....................................................... 96/86

(51) Int. Cl.[7] ............................... H03D 3/24; H03D 3/00; H04L 27/22; H04N 5/455
(52) U.S. Cl. ......................... 375/376; 375/332; 348/726; 329/308
(58) Field of Search ............................ 348/726; 375/376, 375/332; 329/308

(56) References Cited

U.S. PATENT DOCUMENTS 5,440,268 * 8/1995 Taga et al. ............................ 329/308
5,440,587 * 8/1995 Ishikawa ............................... 375/332
5,452,326 * 9/1995 Tanaka ................................. 375/376
5,548,344 * 8/1996 Park ..................................... 348/726

* cited by examiner

Primary Examiner—Stephen Chin
Assistant Examiner—Tony Al-Beshrawi
(74) Attorney, Agent, or Firm—Long, Aldridge & Norman LLP

(57) ABSTRACT

In a digital frequency phase locked loop (FPLL) for a grand alliance (GA) HDTV receiver using a vestigial sideband (VSB) modulation transmission system, the digital FPLL for a VSB transmission system having a VCO and a plurality of NTSC carrier eliminating filters for eliminating interference of NTSC adjacent channels includes a filter for eliminating high-frequency components by converting a digital signal output from one of the plurality of NTSC carrier eliminating filters, a delay for delaying the high-frequency-component-eliminated signal by a predetermined width so that its frequency-versus-phase characteristics are changed linearly, symbol inverter for inverting the symbol of the digital signal output from another of the plurality of NTSC-carrier eliminating filters, a switch for selectively outputting the symbol-inverted signal and the digital signal output from another filter, a second filter for limiting the selectively output signal to a predetermined frequency band, a digital-to-analog (D/A) converter for converting the band-limited-digital signal into an analog signal. The result is that the frequency-versus-phase characteristics of the filter is linear, and the size of digital ASICs gates are remarkably reduced.

25 Claims, 8 Drawing Sheets

DIGITAL FREQUENCY PHASE LOCKED LOOP (FPLL) FOR VESTIGIAL SIDEBAND (VSB) MODULATION TRANSMISSION SYSTEM

BACKGROUND OF THE INVENTION

1. Field of the Invention

The present invention relates to a grand alliance (GA) HDTV receiver using a vestigial sideband (VSB) modulation transmission system, and more particularly, to a digital frequency phase locked loop (FPLL) for a transmission system which can linearly change frequency band phase characteristics by digitally implementing the same in the FPLL of the VSB receiver. Among various transmission systems for GA, an 8 VSB method was developed through various experiments.

2. Discussion of the Related Art

In conventional methods of attenuating only one sideband signal among two sidebands occurring in upper and lower portions of a carrier when a signal is amplitude-modulated, the VSB method also modulates the remaining signal. This causes the band efficiency of a double sideband method using upper and lower sidebands to decrease. To overcome this problem, a single sideband method using only one sideband was developed in the VSB for filter implementation.

Moreover, the VSB method, which is an AM modulation method, has been used by video-related art technicians as a video processing technology.

The above-mentioned 8 VSB has 8 levels of a transmitted signal and adopts a VSB modulation method for releasing the signal as an atmospheric wave. If digital data is modulated into 8 VSB and released to the air via an antenna in a broadcasting station, the broadcasting program can be viewed in homes by receiving the released signal in a HDTV receiver and demodulating the received signal. However, when VSB modulation is executed in the broadcasting station, the signal is released to the air together with a pilot signal for precise demodulation.

Since the frequency for HDTV broadcasting is the same as that for the current NTSC (National Television System Committee) TV broadcasting, the pilot signal should have a very small value to prevent the NTSC broadcasting from being affected by the HDTV broadcasting frequency. For example, if the interval of adjacent two signal levels among 8 levels of the 8 VSB is 2, the magnitude of the pilot signal is 1.25, and the power of a transmission signal is set to be increased by 0.3 dB.

FIG. 1 is a block diagram of a conventional HDTV receiver. A general transmission system will now be described.

Referring to FIG. 1, the conventional HDTV receiver includes a frequency synthesizer 2 for receiving a channel signal and for generating and outputting a first local frequency (1st LO). A first mixer 3 multiplies a broadcasting signal input via an antenna 1 with the first local frequency and outputs the frequency of a desired broadcasting signal. Band pass filter (BPF) 4 filters only the components of the desired broadcasting signal from the output signal of the first mixer 3 and eliminates the remaining components. Second mixer 5 multiplies a second local frequency (2nd LO) output from a VCO 6 (to be described later) with the output of the BPF 4, which is the frequency of the desired broadcasting signal. Surface acoustic wave (SAW) filter 7 removes the section except for the information-containing bands from the output of the second mixer 5, and an intermediate frequency (IF) amplifier 8 converts the signal output from the SAW filter 7 into an intermediate frequency and amplifies the same. Phase delay 12 phase-delays by 90° the output signal of a third local oscillator 11, whose center frequency is fixed. Third mixer 9 multiplies the output signal of the third local oscillator 11 with the signal amplified by the IF amplifier 8 to output an I-channel signal. Fourth mixer 10 multiplies the signal whose center frequency is a fixed output from the third local oscillator 11 with the signal amplified by the IF amplifier 8 to output a Q-channel signal. Automatic frequency control (AFC) filter 13 having a second manual filter for shifting the frequency of the I-channel signal into a phase. Limiter 14 measures the symbol of the output signal of the AFC filter 13, and a fifth mixer 15 multiplies the Q-channel signal of the fourth mixer 10 with the output signal of the limiter 14 and outputs the multiplication result. Automatic phase control (APC) filter 16 restricts the band of the output signal of the fifth mixer 15, and a voltage-controlled oscillator (VCO) 6 outputs the second local frequency (2nd LO) to the second mixer 5 by the control of the output signal of the APC filter 16.

The operation of the above-described configuration will now be explained.

The broadcasting signal, which is in the air, is input to the receiver via the antenna 1. The frequency synthesizer 2 receives a user's selected channel signal and generates a first local frequency signal having 920 MHz of frequency difference from a desired broadcasting signal so that the output of the first mixer 3 is 920 MHz.

The first mixer 3 multiplies the outputs of the antenna 1 and frequency synthesizer 2 so that the frequency of the desired broadcasting signal among signals input via the antenna 1 are 920 MHz Since the center frequency of the BPF 4, having received the output signal of the first mixer 3, is set as 920 MHz only the desired broadcasting signal components are filtered. The remaining components are eliminated.

The second mixer 5 multiplies the second local frequency input from the VCO 6 with the output of the BPF 4 to lower the frequency of the desired broadcasting signal to 44 MHz.

Since all kinds of information are present in the bands ranging from the intermediate frequency of 44 MHz of a HDTV broadcasting signal to 6 MHz, the SAW filter 7 eliminates the remaining section, excluding the information-containing band (6 MHz) from the output of the second mixer 5. The output of the SAW filter 7 is amplified in the IF amplifier 8 and is then input to the third and fourth mixers, 9 and 10 respectively.

The output of the third local oscillator 11, whose center frequency is set to 44 MHz, is input to the fourth mixer 10 and is multiplied with the output of the IF amplifier 8 to generate a Q-channel signal. Also, the output of the third local oscillator 11 is phase-delayed in the 90°-phase delay 12, and is then input to the third mixer 9.

The phase-delayed signal is multiplied with the output signal of the IF amplifier 8 to generate an I-channel signal.

The frequency of the pilot signal inserted in the broadcasting station should exist exactly at 44 MHz from the output of the IF amplifier 8 for normal operation of the remaining receiver sides. However, the frequency does not often exist exactly in 44 MHz. Thus, since the output frequency of the third local oscillator 11 is set to 44 MHz, the beat corresponding to the frequency difference exists in the outputs of the third and fourth mixers if the output frequency of the pilot signal is not 44 HMz in the IF amplifier 8.

In order to remove the beat frequency, a frequency phase locked loop (FPLL) is adopted, with the following configuration. Assuming that the output frequency of the I-channel signal output from the third mixer 9 is Wo and that of the pilot signal of the IF amplifier 8 is Wi, Cos (Wi−Wo) t=Cos ΔWt, where ΔW=Wo−Wi (beat frequency). On the other hand, the Q-channel signal output from the fourth mixer 10 has a format of Sin ΔWt.

The AFC filter 13 is composed of a second manual filter capable of locking the beat frequency of ±100 KHz. Also, the output of the AFC filter 13 has characteristics of changing the frequency into the phase, as well as the characteristic of being a lowpass filter (LPF). Thus, the AFC filter 13 generates output values as indicated in a frequency-versus-phase characteristic graph of FIG. 2 with respect to the respective beat frequencies of the I-channel signal. The output of the AFC filter 13 is input to the limiter 14 for measuring the signal symbol. The output of the limiter 14 is multiplied with the Q-channel signal in the fifth mixer 15 to be output as in the output characteristic graph of FIG. 3.

The output of the fifth mixer 15 is 2 KHz and passes through the APC filter 16, which restricts the signal band to control the VCO 6.

When the beat frequency is present and causes the output of the limiter 14 to change, the frequency locked loop (FLL) process is executed. When the FLL process is terminated and the output of the limiter 14 is no longer changed, a phase locked loop (PLL) for correcting the phase begins. This is shown in the graph of FIG. 4 for the FPLL process.

An analog FPLL process of the 8 VSB receiver adopted in the GA will now be described with reference to accompanying drawings.

FIG. 5 is a block diagram of a conventional analog FPLL. Referring to FIG. 5, the conventional analog FPLL includes a phase delay 12 whose center frequency is fixed by 90° for phase-delaying the output frequency of a third oscillator 11. A third mixer 9 multiples the phase-delayed signal output from the third oscillator 11 with the signal amplified by the IF amplifier 8 shown in FIG. 1. First lowpass filter (LPF) 17 eliminates high-frequency components, except for a bit-frequency from the output of the third mixer 9. First A/D converter 18 samples the output signal of the first LPF 17 in a symbol frequency. First NTSC carrier eliminating filter 19 eliminates interferences of NTSC adjacent channel of the digital data sampled by the first A/D converter 18, and a first D/A converter 20 converts the digital signal output from the first NTSC carrier eliminating filter 19 into an analog signal. Third LPF 21 eliminates components of the analog signal, and an AFC filter 13 converts the frequency of the signal into a phase. Limiter 14 measures the symbol of the output signal of the AFC filter 13. Fourth mixer 10 multiplies the signal amplified by the IF amplifier 8 with the output signal of the third local oscillator 11, and a third LPF 22 eliminates high-frequency components excluding a bit-frequency from the output of the fourth mixer 10. Second A/D converter 23 samples the output signal of the second LPF 22 in a symbol frequency. Second NTSC carrier eliminating filter 24 eliminates interferences of NTSC adjacent channel of the digital data sampled by the second A/D converter 23, and a second D/A converter 25 converts the digital signal output from the second NTSC carrier eliminating filter 24 into an analog signal. Fourth LPF 26 eliminates high-frequency components of the analog signal output from the second D/A converter 25, and a fifth mixer 15 multiples the output of the fourth LPF 26 with the output of the limiter 14. APC filter 16 limits the band of the output signal of the fifth mixer 15.

The operation of the conventional analog FPLL will now be described, with reference to FIG. 5. The output of the third local oscillator 11 is input to the fourth mixer 10 and 90°-phase delay 12. The third mixer 9, as shown in FIG. 1, multiplies the signal amplified in the IF amplifier 8 with the 90°-phase-delayed signal of the output signal of the third local oscillator 11. The fourth mixer 10 multiplies the amplified signal with the output signal of the third local oscillator 11 and then outputs the multiplication result.

The output signal of the fourth mixer 10 eliminates the high-frequency components, excluding the bit-frequency from the first and second LPFs 17 and 22. The first and second A/D converters 18 and 23 sample the output signals of the first and second LPFs 17 and 22 in a symbol frequency. In order to eliminate the interference of NTSC adjacent channels from the sampled digital signals, the first and second NTSC carrier eliminating filters 19 and 24 are used.

The first and second D/A converters 20 and 25 convert the digital signals into analog signals and then the high-frequency components thereof are eliminated by the third and fourth LPFs 21 and 26. The output signal of the third LPF 21, functioning as an LPF, converts from its frequency into a phase through the AFC filter 13. The limiter 14 measures the symbol of the output signal of the AFC filter 13. The output signal of the limiter 14 and that of the fourth LPF 26 are multiplied in the fifth mixer 15 to then be passed through the APC filter 16 for limiting the band of a 2 KHz signal to control the VCO 6.

The conventional FPLL is an analog construction. Therefore, the results are non-linear frequency-versus-phase characteristics in the FPLL processing. Moreover, because the respective elements are of an analog construction, the hardware is bulky.

SUMMARY OF THE INVENTION

Accordingly, the present invention is directed to a digital FLPP that substantially obviates one or more of the problems due to limitations and disadvantages of the conventional analog FPLL.

An object of the present invention is to provide a digital FPLL for a VSB transmission system that allows frequency-versus-phase characteristics to have linearity by implementing the FPLL digitally, and can implement digital ASICs (applications specific integrated circuits) having remarkably reduced gates.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a digital FPLL for a VSB transmission system having a voltage controlled oscillator (VCO) and a plurality of NTSC carrier eliminating filters for eliminating interference of NTSC adjacent channels comprises first filtering means for eliminating high-frequency components by converting a digital signal output from one of the plurality of NTSC carrier eliminating filters; delaying means for delaying the high-frequency-component-eliminated signal by a predetermined width so that changes to its frequency-versus-phase characteristics are linear; symbol inverting means for inverting a symbol of a second digital signal output from another of the plurality of NTSC carrier eliminating filters; switching means for selectively outputting the symbol-inverted signal and the second digital signal output from another filter; second filtering means for limiting the selectively output signal to a predetermined frequency band; digital-to-analog (D/A) converting means for converting the frequency band-limited-digital signal into an analog signal; wherein an FPLL process is processed digitally so that frequency-versus-phase characteristics is made to be linear.

According to another aspect of the present invention, a digital FPLL for a VSB transmission system having a VCO and a plurality of A/D converters comprises first filtering means for eliminating high-frequency components by converting a digital signal output from a first filter of the plurality of NTSC carrier eliminating filters; delaying means for delaying the high-frequency-component-eliminated signal by a predetermined width so that changes to its frequency-versus-phase characteristics are linear; symbol inverting means for inverting a symbol of a second digital signal output from a second filter of the plurality of NTSC carrier eliminating filters; switching means for selectively outputting the symbol-inverted signal and the second digital signal output from the second filter depending on the delayed signal; digital-to-analog (D/A) converting means for converting the digital signal output from the switching means into an analog signal; and second filtering means for limiting the selectively output signal to a predetermined frequency band.

In another aspect, the present invention provides a digital frequency phase locked loop (FPLL) for a vestigial sideband (VSB) transmission system having a voltage controlled oscillator (VCO) and a plurality of National Television System Committee (NTSC) carrier eliminating filters for eliminating interference of NTSC adjacent channels, comprising first filtering means for eliminating high-frequency components by converting a digital signal output from a first filter of the plurality of NTSC carrier eliminating filters; delaying means for delaying the high-frequency-component-eliminated signal by a predetermined width so that changes to its frequency-versus-phase characteristics are linear; symbol inverting means for inverting a symbol of a second digital signal output from a second filter of the plurality of NTSC carrier eliminating filters; switching means for selectively outputting the symbol-inverted signal and the second digital signal output from the second filter depending on the delayed signal; pulse width modulating means for performing pulse width modulation on the output of the switching means with a basic pulse width of a symbol frequency; and second filtering means for eliminating high-frequency components of the modulated signal and limiting a frequency band of the signal.

In another aspect, the present invention provides a digital frequency phase locked loop (FPLL) for a vestigial sideband (VSB) transmission system having a voltage controlled oscillator (VCO) and a plurality of National Television System Committee (NTSC) carrier eliminating filters for eliminating interference of NTSC adjacent channels, a third local oscillator and an intermediate frequency (IF) amplifier, comprising a phase delay means for delaying by 90° a phase of a center frequency signal output from the third local oscillator; a first mixer for mixing the phase-delayed signal output from said third local oscillator with the signal amplified by the IF amplifier; a second mixer for mixing the output signal of the third local oscillator with the signal amplified by the IF amplifier; first and second low pass filters (LPFs) for eliminating high-frequency components, excluding a bit-frequency, from the respective outputs of the first and second mixers; first and second analog-to-digital (A/D) converters for sampling the output signals of the first and second LPFs in a symbol frequency; first and second National Television System Committee (NTSC) carrier eliminating filters for eliminating interference of NTSC adjacent channels from the digital data A/D converted and sampled by the first and second A/D converters; a finite impulse response (FIR) LPF for changing the frequency of the digital signal output from the first NTSC carrier eliminating filter into a phase and eliminating high-frequency components thereof; delay means for delaying the high-frequency-component-eliminated signal by a predetermined width so that changes to its frequency-versus-phase characteristics are changed linearly; symbol inverter means for inverting a symbol of the digital signal output from the second NTSC carrier eliminating filter; a multiplexer (MUX) for selectively outputting the symbol-inverted signal and the digital signal output from the second NTSC carrier eliminating filter depending on the delayed signal; a finite impulse response (FIR) automatic phase control (APC) LPF for limiting a band of the selectively output signal into a predetermined frequency band; a D/A converter for converting the frequency-band-limited digital signal into an analog signal; and a third LPF for eliminating the high-frequency components of the converted analog signal to control the VCO.

In another aspect, the present invention provides a digital frequency phase locked loop (FPLL) for a vestigial sideband (VSB) transmission system having a voltage controlled oscillator (VCO), a third local oscillator and an intermediate frequency (IF) amplifier comprising a phase delay for delaying by 90° a phase of a center frequency signal output from the third local oscillator; a first mixer for mixing the phase-delayed signal output from the third local oscillator with a signal amplified by the IF amplifier; a second mixer for mixing the output signal of the third local oscillator with the signal amplified by the IF amplifier; first and second low pass filters (LPFs) for eliminating high-frequency components, excluding a bit-frequency, from the respective outputs of the first and second mixers; first and second analog-to-digital (A/D) converters for sampling the output signals of the first and second LPFs in a symbol frequency; first and second National Television System Committee (NTSC) carrier eliminating filters for eliminating interference of NTSC adjacent channels from the digital data A/D converted and sampled by the first and second A/D converters; a finite impulse response (FIR) LPF for changing the frequency of the digital signal output from the first NTSC carrier eliminating filter into a phase and eliminating high-frequency components thereof; delay means for delaying the high-frequency-component-eliminated signal by a predetermined width so that changes to its frequency-versus-phase characteristics are linear; symbol inverter means for inverting a symbol of the digital signal output from the second NTSC carrier eliminating filter; a multiplexer (MUX) for selectively outputting the symbol-inverted signal and the digital signal output from the second NTSC carrier eliminating filter depending on the delayed signal; a digital-to-analog (D/A) converter for converting the digital signal output from the MUX into an analog signal; and an automatic phase control (APC) LPF for eliminating high-frequency components of the output signal of the converted analog signal and limiting a frequency band of the signal.

In another aspect, the present invention provides a digital frequency phase locked loop (FPLL) for a vestigial sideband (VSB) transmission system having a voltage controlled oscillator (VCO), a third local oscillator and an intermediate frequency (IF) amplifier comprising phase delay means for delaying by 90° a phase of a center frequency signal output from the third local oscillator; a first mixer for mixing the phase-delayed signal output from the third local oscillator with the signal amplified by the IF amplifier; a second mixer for mixing the output signal of the third local oscillator with the signal amplified by the IF amplifier; first and second low pass filters (LPFs) for eliminating high-frequency components, excluding a bit-frequency, from the respective outputs of the first and second mixers; first and second analog-to-digital (A/D) converters for sampling the output signals of the first and second LPFs in a symbol frequency; first and second National Television System Committee (NTSC) carrier eliminating filters for eliminating interference of NTSC adjacent channels from digital data A/D converted and sampled by the first and second A/D converters; a finite impulse response (FIR) LPF for changing the frequency of the digital signal output from the first NTSC carrier eliminating filter into a phase and eliminating high-frequency components thereof; delay means for delaying the high-frequency-component-eliminated signal by a predetermined width so that changes to its frequency-versus-phase characteristics are linear; symbol inverter means for inverting a symbol of the digital signal output from the second NTSC carrier eliminating filter; a multiplexer (MUX) for selectively outputting the symbol-inverted signal and the digital signal output from the second NTSC carrier eliminating filter depending on the delayed signal; a pulse width modulator for performing pulse width modulation to the output of the multiplexer with a basic pulse width of a symbol frequency; and an automatic phase control (APC) LPF for eliminating high-frequency components of the output signal of the modulated signal and limiting the band of the signal.

In another aspect, the present invention provides a digital frequency phase locked loop (FPLL) for a vestigial sideband (VSB) transmission system having a voltage controlled oscillator (VCO) and a plurality of analog-to-digital (A/D) converters, comprising first and second filtering means for eliminating interference of National Television System Committee (NTSC) adjacent channels of digital data output from the respective plurality of A/D converters and sampled at a symbol frequency, and for eliminating effects of the data's phase characteristics; symbol inverting means for inverting a symbol of the signal output from the second filtering means; delaying means for delaying the signal output from the first filtering means by a predetermined width; switching means for selectively outputting the digital signal output from the symbol inverting means and the signal output from the second filtering means depending on the signal output from the delaying means; digital-to-analog (D/A) converting means for converting the digital signal selectively output from the switching means into an analog signal; and third filtering means for eliminating high-frequency components of the analog signal output from the D/A converting means to control the VCO.

In another aspect, the present invention provides a digital frequency phase locked loop (FPLL) for a vestigial sideband (VSB) transmission system having a voltage controlled oscillator (VCO), a third local oscillator, and an intermediate frequency (IF) amplifier, comprising a phase delay means for delaying by 90° a phase of a center frequency signal output from the third local oscillator; a first mixer for mixing the phase-delayed signal output from the third local oscillator with a signal amplified by the IF amplifier; a second mixer for mixing the output signal of the third local oscillator with the signal amplified by the IF amplifier, first and second low pass filters (LPFs) for eliminating high-frequency components, excluding a bit-frequency, from the respective outputs of the first and second mixers; first and second analog-to-digital (A/D) converters for sampling the output signals of the first and second LPFs at a symbol frequency; first and second infinite impulse response (IIR) LPFs for eliminating interference of National Television System Committee (NTSC) adjacent channels from the digital data sampled by the first and second A/D converters and eliminating effects due to the interference for intrinsic phase characteristics; a symbol inverter for inverting a symbol of the digital signal output from the second IIR LPF; a delay for delaying the signal output from the first IIR LPF by a predetermined width; a multiplexer (MUX) for selectively outputting signals output from the symbol inverter and second IIR LPF depending on the delayed signal; a digital-to-analog (D/A) converter for converting the digital signal selectively output from the multiplexer into an analog signal; and an LPF for eliminating high-frequency components of the analog signal output from the D/A converter to control the VCO.

In a further aspect, the present invention provides a digital frequency phase locked loop (FPLL) for a vestigial sideband (VSB) transmission system having a voltage controller oscillator (VCO) and a plurality of analog-to-digital (A/D) converters, comprising first filtering means for changing into a phase frequency of digital signal outputs from the respective plurality of A/D converters and sampled in a symbol frequency; symbol inverting means for inverting a symbol of the signal output from a first converter of the plurality of A/D converters; switching means for selectively outputting the signal output from the first converter and the symbol-inverted signal according to the signal output from the first filtering means; digital-to-analog(D/A) converting means for converting the digital signal output from the switching means into an analog signal; and second filtering means for eliminating the high-frequency components of the analog signal output the D/A converting means to control the VCO.

In a further aspect, the present invention provides a digital frequency phase locked loop (FPLL) for a vestigial side band (VSB) transmission system having a voltage controller oscillator (VCO), a third local oscillator and an intermediate frequency (IF) amplifier, comprising a phase delay means for delaying by 90° a phase of a center frequency output from the third local oscillator; a first mixer for mixing the phase-delayed signal output from the third local oscillator with a signal amplified by the amplifier; a second mixer for mixing the output signal of the third local oscillator with the signal amplified by the IF amplifier; first and second low pass filters (LPFs) for eliminating high-frequency components, excluding the bit-frequency, from the respective outputs of the first and second mixers; first and second analog-to-digital (A/D) converters for sampling the output signals of the first and second LPFs in a symbol frequency; a symbol inverter for inverting the symbol of the digital signal output from the second A/D converter; a 2-Tap infinite impulse response (IIR) LPF for converting the frequency of the digital signal output from the first A/D converter into a phase; a multiplexer (MUX) for selectively outputting the digital signal output from the symbol inverter and the signal output from the second A/D converter depending on the 2-Tap IIR LPF; a digital-to-analog (D/A) converter for converting the digital signal selectively output from the multiplexer into an analog signal; and an LPF for eliminating high-frequency components of the analog signal output from the D/A converter to control the VCO.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

EMBODIMENT 1

Figure 6:
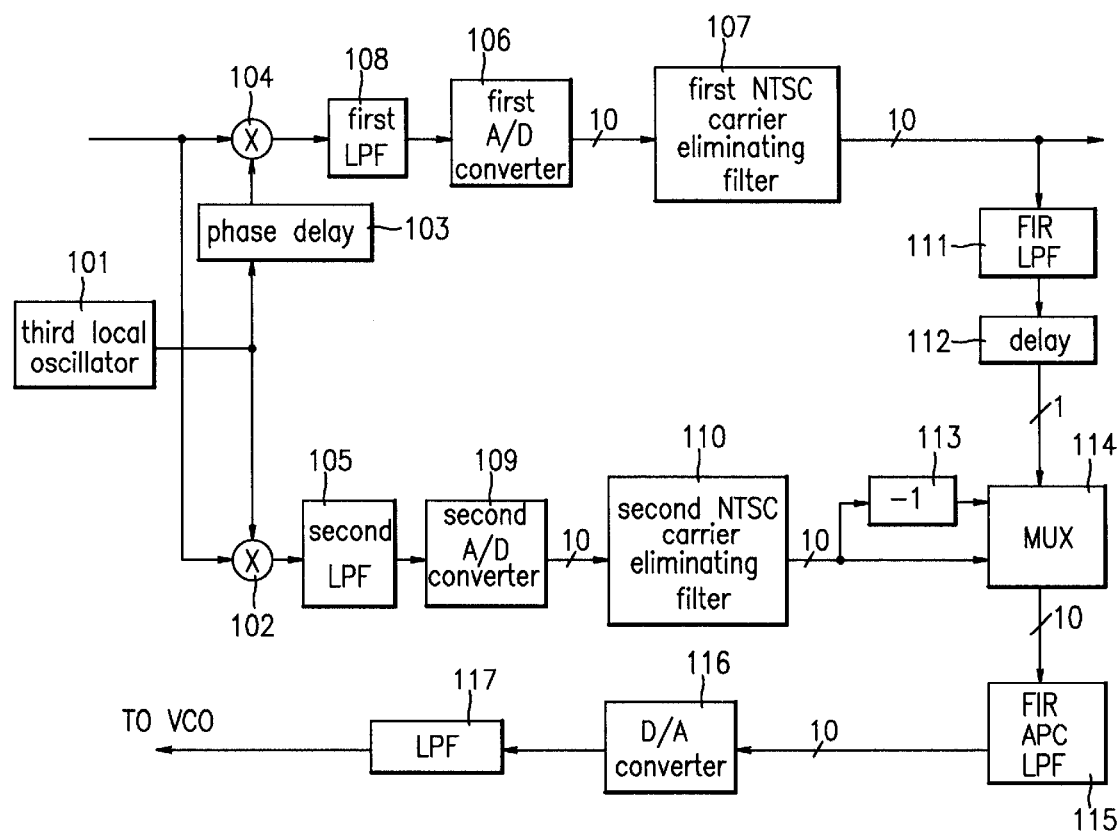
FIG. 6 is a block diagram of a digital FPLL for a VSB transmission system according to a first embodiment of the present invention.

FIG. 6 is a block diagram of a digital FPLL for a VSB transmission system according to a first embodiment of the present invention. In this embodiment, the FPLL process is processed digitally by using NTSC carrier eliminating filters, as shown in the conventional art of FIG. 1.

Referring to FIG. 6, the digital FPLL includes a third local oscillator 101 whose center frequency is fixed, and a third phase delay 103 for delaying the phase of the center frequency output from the third local oscillator 101 by 90°. First mixer 104 multiplies the phase-delayed signal output from the third local oscillator 101 with the signal amplified by the IF amplifier 8 of FIG. 1 to output the multiplication result. First LPF 108 eliminates the high-frequency components, excluding the bit-frequency, from the output of the first mixer 104, and first A/D converter 106 samples the output signal of the first LPF 108 in a symbol frequency (10.76 MHz) and converts the same into a digital signal. First NTSC carrier eliminating filter 107 eliminates the interference of NTSC adjacent channels from the sampled digital data to output a 10-bit I' signal, and finite impulse response (FIR) LPF 111 changes the frequency of the 10-bit I' signal into a phase and eliminates high-frequency components. Delay 112 delays only the most significant bit (MSB) as a symbol bit (1 bit) from the 10-bit I' signal. Second mixer 102 multiplies the output signal of the third local oscillator 101 with the signal amplified by the IF amplifier 8 (FIG. 1) to output the multiplication result. Second LPF 105 eliminates the high-frequency components, excluding the bit-frequency, from the output of the second mixer 102, and second A/D converter 109 samples the output signal of the second LPF 105 in a symbol frequency (10.76 MHz). Second NTSC carrier eliminating filter 110 eliminates the interference of NTSC adjacent channels from the sampled digital data to output a Q' signal. Symbol inverter 113 inverts the symbol of the Q' signal, and multiplexer (MUX) 114 selectively outputs the symbol-inverted Q' signal output from the symbol inverter 113 or the Q' signal from the second NTSC carrier eliminating filter 110. FIR APC LPF 115 limits the band of the signal output from the MUX 114, a D/A converter 116 converts the digital signal of the FIR APC LPF 115 into an analog signal, and a third LPF 117 eliminates the high-frequency components of the converted analog signal to control the VCO.

The operation of the digital FPLL according to the first embodiment of the present invention will now be described. As shown in FIG. 6, the output of the third local oscillator 101 is input to the second mixer 102, or is phase-delayed to then be input to the first mixer 104.

The outputs of the first and second mixers 104 and 102 pass through the first and second LPFs 105 and 108 in order to eliminate the high-frequency components, excluding the bit-frequency. The first and second A/D converters 106 and 109 sample the output signals of the first and second LPF 105 and 108 in a symbol frequency (10.76 MHz). In order to eliminate the interference of NTSC adjacent channels from the sampled digital signal, the first and second NTSC carrier eliminating filters 107 and 110 are used.

The output of the second NTSC carrier eliminating filter 110 is a Q'-channel signal, and that of the first NTSC carrier eliminating filter 107 is an I'-channel signal. The I'-channel signal passes through the FIR LPF 111 serving as the LPF of the analog AFC filter. Since all signals containing data, except a pilot among transmitted signals, are regarded as noise in the FPLL processing, it is preferable to reduce the bandwidth of the FIR LPF 111 to 6 MHz or below in order to the reduce data interference.

Figure 7:
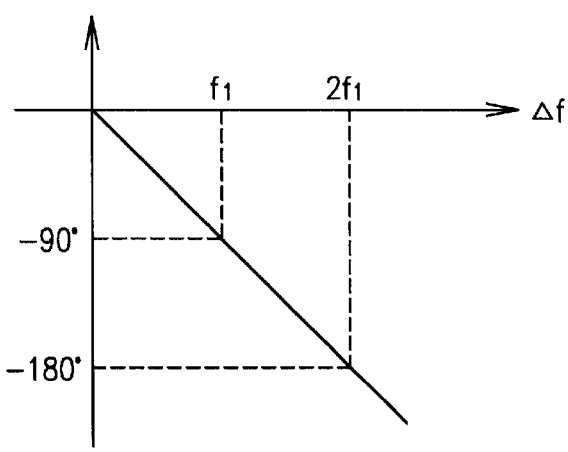
FIG. 7 is a graph showing linear frequency-versus-phase characteristics of a digital FPLL for a VSB transmission system according to the present invention.

The frequency-versus-phase characteristics of the conventional analog AFC filter can be made to be linear, as shown in FIG. 7. FIG. 7 is a graph showing linear frequency-versus-phase characteristics, by using a sampling delay element in the digital FPLL. Thus, if only the MSB for determining the signal symbol among the currently used 10-bit digital data is input from the FIR LPF 111 to the delay 112, the limiter used for the analog FPLL is not necessary.

Unlike the mixers used in analog FPLL, the Q'-channel signal output from the second NTSC carrier eliminating filter 110 is passed through the symbol inverter 113 to change the symbol thereof and then is input to the MUX 114. The Q'-channel signal is input to the MUX 114 so that the output signal of the delay 112 is used as the control signal of the MUX 114.

The output of the MUX 114, which is 2 KHz, passes through the FIR APC LPF 115 having the same characteristics as those of the APC filter or the conventional analog FPLL, for limiting the band of the signal. This output is converted into an analog signal, so that the high-frequency components are eliminated in the third LPF 117 to control the VCO 6 of FIG. 1.

EMBODIMENT 2

Figure 8:
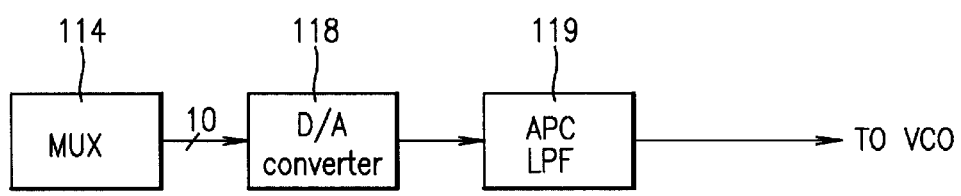
FIG. 8 is a partial block diagram of a digital FPLL of an 8 VSB transmission system according to a second embodiment of the present invention.

FIG. 8 is a partial block diagram of a digital FPLL of an 8 VSB transmission system according to a second embodiment of the present invention. Discussion of the elements that are similar to those of the first embodiment shown in FIG. 6 will be omitted.

Referring to FIG. 8, the signal output from the MUX 114 of FIG. 6 is converted by the D/A converter 118, the high-frequency components of the converted analog signal are eliminated, and the signal band is limited by the APC LPF 119.

As a result, this embodiment is different from the first embodiment of FIG. 6 in that the signal output from the MUX 114 is first D/A converted without being filtered as in the first embodiment, and is then filtered.

Figure 1:
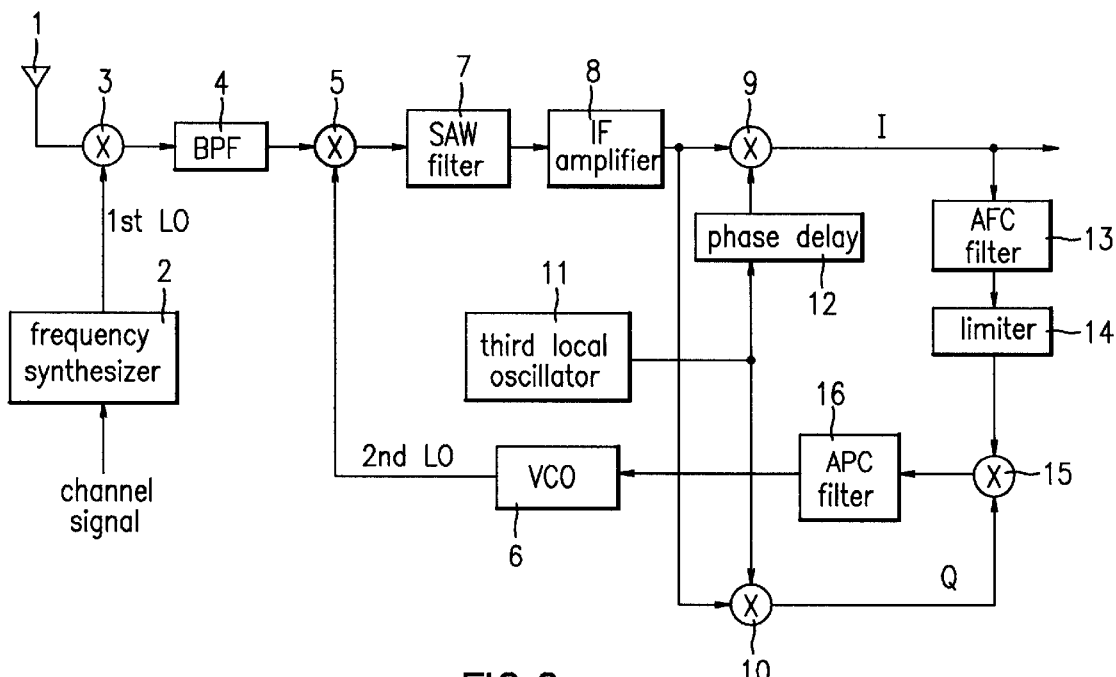
FIG. 1 is a block diagram of a conventional HDTV receiver.

The operation of the device according to the second embodiment of the present invention will now be described. As shown in FIG. 8, the output of the MUX 114 is converted into an analog signal by the D/A converter 118, and is used to control the VCO 6 by the APC LPF 119 having the same characteristics as those of the APC filter 16 (FIG. 1). Thus, the functions of the analog LPF 117 for eliminating the high-frequency components of the output of the D/A converter 116 and FIR APC LPF 115 are simultaneously performed. Therefore, the FIR APC LPF 115 and LPF 117 of the first embodiment can be constructed by a single LPF 119.

EMBODIMENT 3

Figure 9:
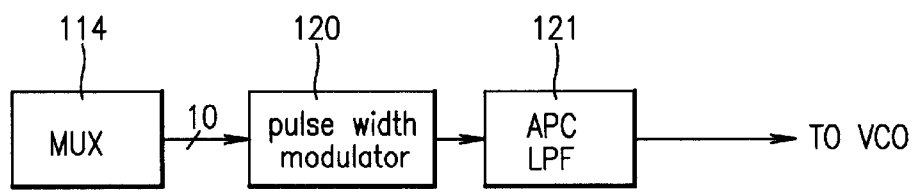
FIG. 9 is a partial block diagram of a digital FPLL of an 8 VSB transmission system according to a third embodiment of the present invention.

FIG. 9 is a partial block diagram of a digital FPLL of an 8 VSB transmission system according to a third embodiment of the present invention. Discussion of the element that are similar to those of the first embodiment shown in FIG. 6 will be omitted.

Referring to FIG. 9, the signal output from the MUX 114 of FIG. 6 is passed through the pulse width modulator 120 for performing a pulse width modulation (PWM) with a basic pulse width of a symbol frequency (10.76 MHz). Thus, the D/A converter 118 is unnecessary. The signal is input to the APC LPF 121 for performing the same function as that of the APC LPF 119 of FIG. 8, i.e, to control the VCO 6 by means of the output of the APC LPF 121.

Figure 10:
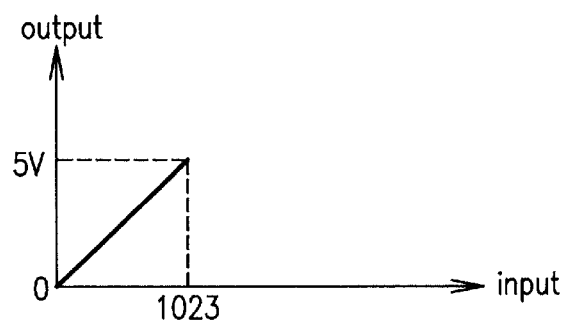
FIG. 10 is a graph showing input-versus-output characteristics of a D/A converter shown in FIG. 8.
Figure 11:
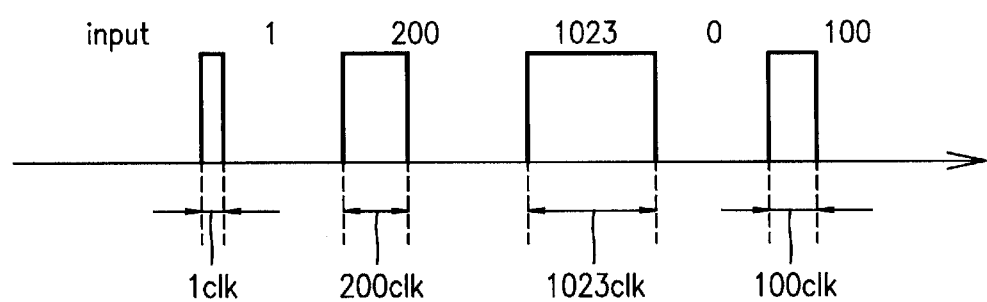
FIG. 11 is a graph showing input-versus-output characteristics of a pulse width modulator shown in FIG. 9.

According to the third embodiment of the present invention, the pulse width modulator 120 changes the pulse width of the 10-bit input data value based on a symbol frequency (10.76 MHz), as shown in FIG. 11, without changing the 10-bit data input to the D/A converter 118 into a voltage of 0~5V as in the second embodiment of FIG. 10. By doing so, data can be obtained for the outputs of the APC LPF 121 without using a D/A converter and LPF 117 of FIG. 8.

Thus, the frequency-versus-phase characteristics of the FPLL becomes linear. Also, in implementing the ASICs, the number of gates can be remarkably reduced so that a digital ASIC rather than the analog ASIC can be used.

EMBODIMENT 4

Figure 12:
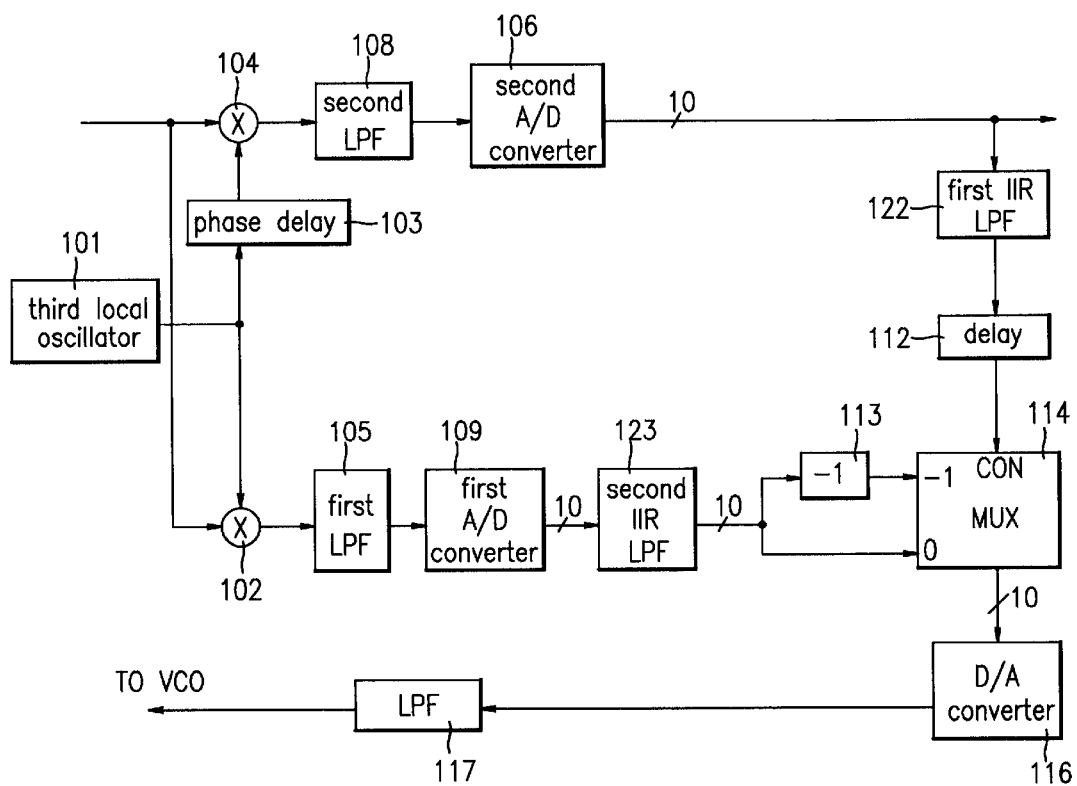
FIG. 12 is a partial block diagram of a digital FPLL of a VSB transmission system according to a fourth embodiment of the present invention.

FIG. 12 is a block diagram of a digital FPLL of a VSB transmission system according to a fourth embodiment of the present invention. Discussion of the elements that are similar to those of the first embodiment shown in FIG. 6 will be omitted.

Referring to FIG. 12, the digital FPLL includes first and second infinite impulse response (IIR) LPFs 122 and 123 for eliminating the interference of NTSC adjacent channels of the digital data sampled in the first and second A/D converters 106 and 109 and for eliminating the effects due to the interference for intrinsic phase characteristics. Symbol inverter 113 inverts the symbol of the signal output from the first and second IIR LPFs 122 and 123, and delay 112 delays the signal output from the first IIR LPF 122 by a predetermined width. Multiplexer 114 selectively outputs the signals output from the symbol inverter 113 and second IIR LPF 123, depending on the signal delayed in the delay 112. D/A converter 116 converts the selectively output digital signal of the multiplexer 114 into an analog signal, and an LPF 117 eliminates the high-frequency components of the analog signal output from the D/A converter 116 to control the VCO.

Operation of the FPLL according to the fourth embodiment of the present invention now will be described.

The phase delay 103 delays the phase of a fixed center frequency of the third local oscillator 101 by 90°, and then inputs the same to the first and second mixers 104 and 102. The first mixer 104 mixes the signal output from the third local oscillator 101 and 90°-phase-delayed in the phase delay 103 with the signal amplified in the IF amplifier 8.

The output signal amplified in the IF amplifier 8 and the output signal of the third local oscillator 101 are mixed in the second mixer 102. From the signals mixed in the first and second mixers 104 and 102, the high-frequency components thereof, excluding the bit-frequency, are eliminated in the first and second LPFs 105 and 108 to then be output to the first and second A/D converters 109 and 106.

The sampled signal eliminates the interference of NTSC adjacent channels of the digital data and eliminates the effects due to the interference for intrinsic phase characteristics in the first and second IIR LPFs 122 and 123.

The frequency-versus-phase characteristics of the output of the first IIR LPF 122 is changed linearly in the delay 112. The output signal of the second IIR LPF 123 and the signal symbol-inverted by the symbol inverter 113 are selectively output from the MUX 114. The digital signal selectively output from the MUX 114 is converted into an analog signal in the D/A converter 116 and then the high-frequency components of the analog signal are eliminated to control the VCO by the third LPF 117.

As shown in FIG. 12, the first and second IIR LPFs 122 and 123 are connected to the outputs of the A/D converters 106 and 109. The first and second IIR LPFs 122 and 123 are capable of reducing the number of taps more efficiently than the FIR LPF 111 of the second embodiment, thereby reducing the number of gates in designing ASICs. Thus, the first and second IIR LPFs 122 and 123 are used for limiting the band of the AFC filter for the analog FPLL, and the MSB (1 bit) among the outputs of the first IIR LPF 122 is input to the delay 112.

The function of the delay 112 is the same as that of the delay 112 of the first embodiment of the present invention. Also, the frequency-versus-phase characteristics of the output of the delay 112 are the same as those shown in FIG. 7.

In order to eliminate the effects due to the interference for intrinsic phase characteristics of the second IIR LPF 123, the IIR LPF 122, having the same configuration as the IIR LPF 123, is connected to the output of the A/D converter 106.

In FIG. 12, the NTSC carrier eliminating filters 107 and 110, as shown in FIG. 6, for eliminating the interference of NTSC adjacent channels are not used because the two IIR LPFs 122 and 123 perform the above function.

EMBODIMENT 5

Figure 13:
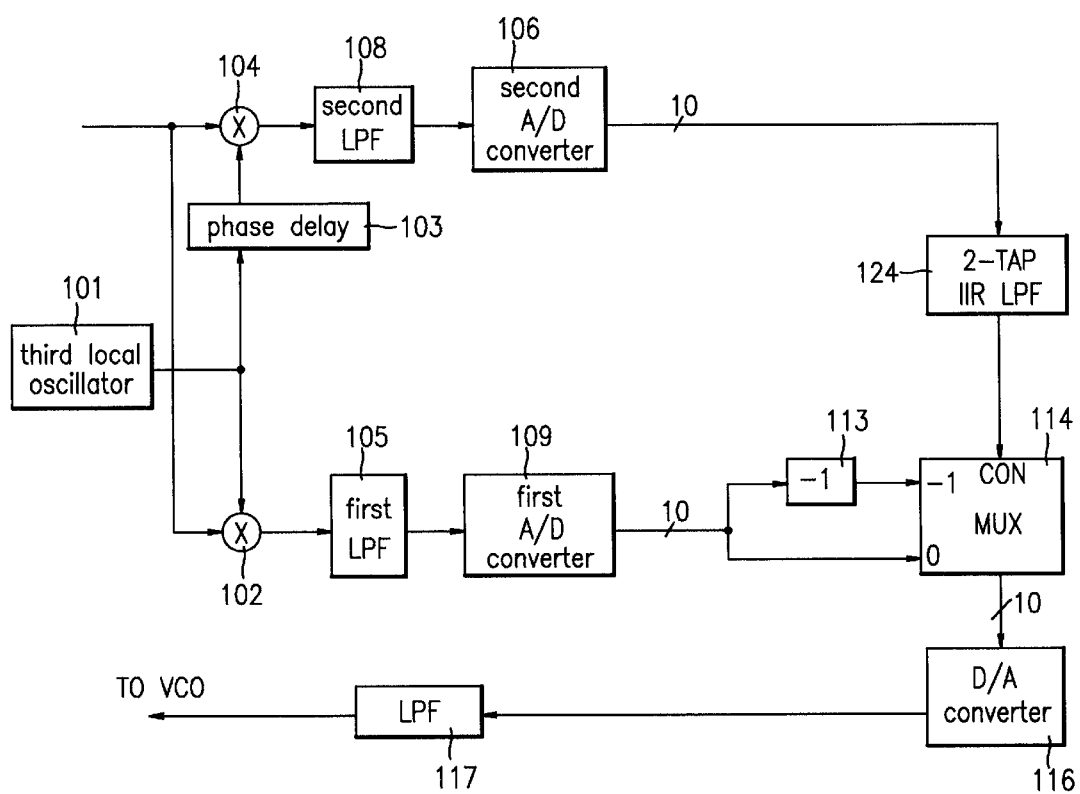
FIG. 13 is a partial block diagram of a digital FPLL of a VSB transmission system according to a fifth embodiment of the present invention.

FIG. 13 is a block diagram of a digital FPLL of a VSB transmission system according to a fifth embodiment of the present invention. Discussion of the elements that are similar to those of the fourth embodiment will be omitted.

Referring to FIG. 13, the digital FPLL of the fifth embodiment includes a symbol inverter 113 for inverting the symbol of the digital signal output of the first A/D converter 106, and a 2-Tap IIR LPF 124 for converting the frequency of the digital signal output from the second A/D converter 109 into a phase. MUX 114 selectively outputs the digital signal input from the symbol inverter 113 and the digital signal output from the second A/D converter 106 depending on the output signal of the 2-Tap IIR LPF 124. D/A converter 116 converts the selectively output digital signal output from the second A/D converter 109 into an analog signal, and a third LPF 117 eliminates the high-frequency components of the analog signal output from the D/A converter 116 to control the VCO.

Operation of the digital FPLL for an 8 VSB transmission system according to the fifth embodiment of the present invention will now be described.

Figure 2:
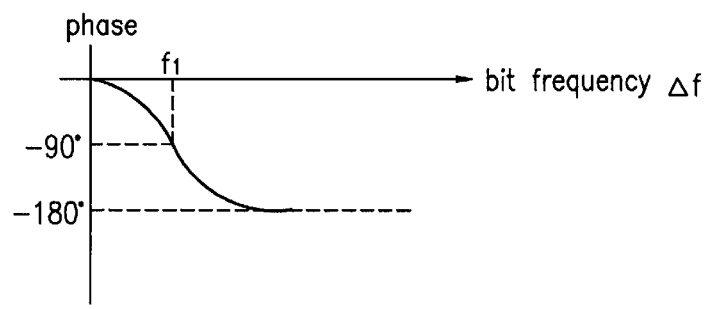
FIG. 2 is a graph showing frequency-versus-phase characteristics of an AFC filter shown in FIG. 1.
Figure 3:
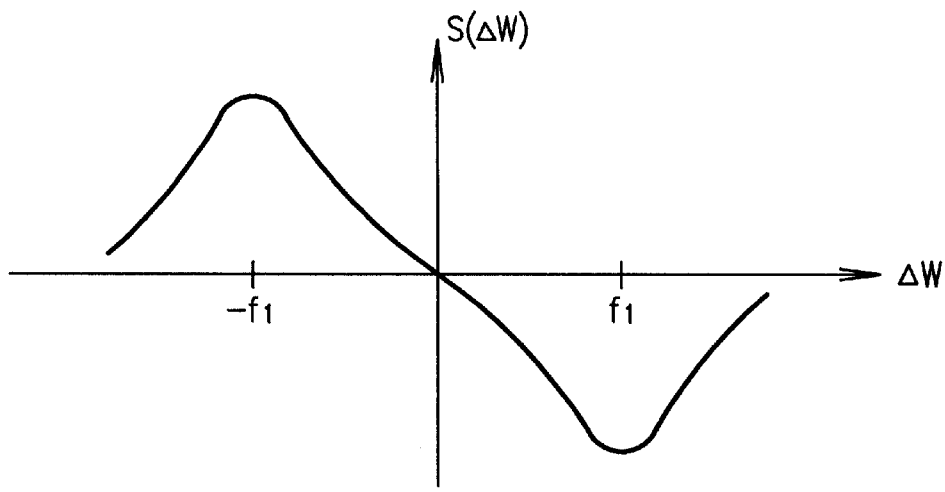
FIG. 3 is a graph showing output characteristics of mixers shown in FIG. 1.
Figure 4:
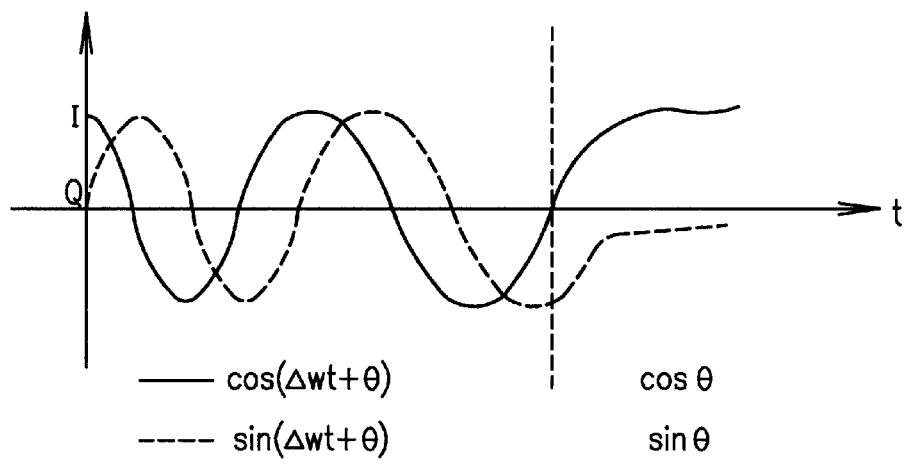
FIG. 4 illustrates an FPLL process of FIG. 1.
Figure 5:
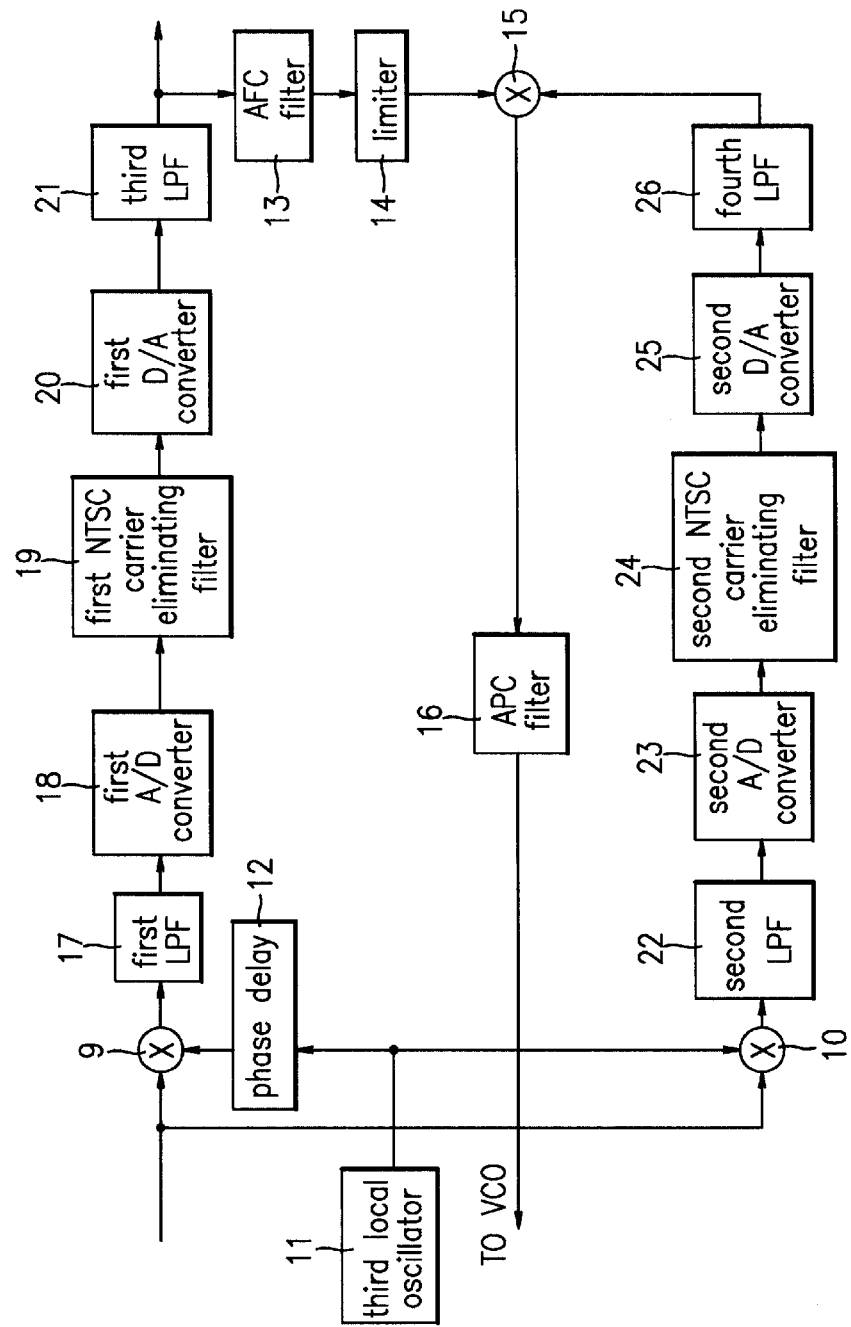
FIG. 5 is a block diagram of a conventional analog FPLL.

The most significant feature of this embodiment is to use the 2-Tap IIR LPF 124 having the same band characteristics and frequency-versus-phase characteristics as those of the second manual AFC filter 13 of the conventional art. The frequency-versus-phase characteristics of the output of the 2-Tap IIR LPF 124 are shown in FIG. 2.

In the fifth embodiment of the present invention shown in FIG. 13, the delay 112 corresponding to the delay of FIG. 12 is not used, but the MSB of 1 bit from the output of the 2-Tap IIR LPF 124 is used as the control signal of the MUX 114. Also, if the LPF 117 having band characteristics so as to filter only bit frequencies is designed, the NTSC carrier eliminating filter 110 of FIG. 6 is not necessary.

Moreover, if the 2-Tap IUR LPF 124 is designed to have band characteristics by which the interference of NTSC adjacent channels is reduced, the NTSC carrier eliminating filter 110 of FIG. 6 is not necessary.

Furthermore, if the digital FPLL is constructed as shown in FIG. 13, the frequency-versus-phase characteristics of the AFC filter (2-Tap IIR LPF) become nonlinear. However, the number of gates necessary for designing ASICs is noticeably reduced.

It will be apparent to those skilled in the art that various modifications and variations can be made in the digital frequency phase locked loop (FPLL) for vestigial sideband (VSB) modulation transmission system of the present invention without departing from the spirit or scope of the invention. Thus, it is intended that the present invention cover the modifications and variations of this invention provided they come within the scope of the appended claims and their equivalents.

What is claimed is:

1. A digital frequency phase locked loop (FPLL) for a vestigial sideband (VSB) transmission system having a voltage controlled oscillator (VCO) and a plurality of National Television System Committee (NTSC) carrier eliminating filters for eliminating interference of NTSC adjacent channels, comprising:

first filtering means for eliminating high-frequency components by converting a digital signal output from one of the plurality of NTSC carrier eliminating filters;

delaying means for delaying the high-frequency-component-eliminated signal by a predetermined width so that changes to its frequency-versus-phase characteristics are linear;

symbol inverting means for inverting a symbol of a second digital signal output from another of the plurality of NTSC carrier eliminating filters;

switching means for selectively outputting the symbol-inverted signal and the second digital signal output from another filter;

second filtering means for limiting the selectively output signal to a predetermined frequency band;

digital-to-analog (D/A) converting means for converting the frequency band-limited-digital signal into an analog signal; and wherein an FPLL process is processed digitally so that frequency-versus-phase characteristics are linear.

2. The digital FPLL for a VSB transmission system according to claim 1, wherein the first filtering means is a finite impulse response (FIR) low pass filter (LPF).

3. The digital FPLL for a VSB transmission system according to claim 1, wherein the switching means is a multiplexer.

4. The digital FPLL for a VSB transmission system according to claim 1, wherein the second filtering means is an FIR automatic phase control (APC) LPF.

5. A digital frequency phase locked loop (FPLL) for a vestigial sideband (VSB) transmission system having a voltage controlled oscillator (VCO) and a plurality of National Television System Committee (NTSC) carrier eliminating filters for eliminating interference of NTSC adjacent channels, comprising:

first filtering means for eliminating high-frequency components by converting a digital signal output from a first filter of the plurality of NTSC carrier eliminating filters;

delaying means for delaying the high-frequency-component-eliminated signal by a predetermined width so changes to its frequency-versus-phase characteristics are linear, symbol inverting means for inverting a symbol of a second digital signal output from a second filter of the plurality of NTSC carrier eliminating filters;

switching means for selectively outputting the symbol-inverted signal and the second digital signal output from the second filter depending on the delayed signal;

digital-to-analog (D/A) converting means for converting the digital signal output from the switching means into an analog signal; and second filtering means for limiting the selectively output signal to a predetermined frequency band.

6. The digital FPLL for a VSB transmission system according to claim 5, wherein the first filtering means is a finite impulse response (FIR) low pass filter (LPF).

7. The digital FPLL for a VSB transmission system according to claim 5, wherein the switching means is a multiplexer.

8. A digital FPLL for a VSB transmission system according to claim 5, wherein the second filtering means is an automatic phase control (APC) LPF.

9. A digital frequency phase locked loop (FPLL) for a vestigial sideband (VSB) transmission system having a voltage controlled oscillator (VCO) and a plurality of National Television System Committee (NTSC) carrier eliminating filters for eliminating interference of NTSC adjacent channels, comprising:

first filtering means for eliminating high-frequency components by converting a digital signal output from a first filter of the plurality of NTSC carrier eliminating filters;

delaying means for delaying the high-frequency-component-eliminated signal by a predetermined width so that changes to its frequency-versus-phase characteristics are linear;

symbol inverting means for inverting a symbol of a second digital signal output from a second filter of the plurality of NTSC carrier eliminating filters;

switching means for selectively outputting the symbol-inverted signal and the second digital signal output from the second filter depending on the delayed signal;

pulse width modulating means for performing pulse width modulation of the output of the switching means with a basic pulse width of a symbol frequency; and second filtering means for eliminating high-frequency components of the modulated signal and limiting a frequency band of the signal.

10. The digital FPLL for a VSB transmission system according to claim 9, wherein the first filtering means is a finite impulse response (FIR) low pass filter (LPF).

11. The digital FPLL for a VSB transmission system according to claim 9, wherein the switching means is a multiplexer.

12. The digital FPLL for a VSB transmission system according to claim 9, wherein the second filtering means is an automatic phase control (APC) LPF.

13. A digital frequency phase locked loop (FPLL) for a vestigial sideband (VSB) transmission system having a voltage-controlled oscillator, a third local oscillator and an intermediate frequency (IF) amplifier, comprising:

a phase delay for delaying by 90° a phase of a center frequency signal output from the third local oscillator;

a first mixer for mixing the phase-delayed signal output from the third local oscillator with a signal amplified by the IF amplifier;

a second mixer for mixing the output signal of the third local oscillator with the signal amplified by the IF amplifier;

first and second low pass filters (LPFs) for eliminating high-frequency components, excluding a bit-frequency, from the respective outputs of the first and second mixers;

first and second analog-to-digital (A/D) converters for sampling the output signals of the first and second LPFs in a symbol frequency;

first and second National Television System Committee (NTSC) carrier eliminating filters for eliminating interference of NTSC adjacent channels from the digital data A/D converted and sampled by the first and second A/D converters;

a finite impulse response (FIR) LPF for changing the frequency of the digital signal output from the first NTSC carrier eliminating filter into a phase and eliminating high-frequency components thereof;

delay means for delaying the high-frequency-component-eliminated signal by a predetermined width so that changes to its frequency-versus-phase characteristics are linear;

symbol inverter means for inverting a symbol of the digital signal output from the second NTSC carrier eliminating filter;

a multiplexer (MUX) for selectively outputting the symbol-inverted signal and the digital signal output from the second NTSC carrier eliminating filter depending on the delayed signal;

a finite impulse response (FIR) automatic phase control (APC) LPF for limiting a band of the selectively output signal into a predetermined frequency band;

a digital-to-analog (D/A) converter for converting the frequency-band-limited digital signal into an analog signal; and a third LPF for eliminating the high-frequency components of the converted analog signal to control the VCO.

14. A digital frequency phase locked loop (FPLL) for a vestigial sideband (VSB) transmission system having a voltage-controlled oscillator, a third local oscillator and an intermediate frequency (IF) amplifier, comprising:

a phase delay for delaying by 90° a phase of a center frequency signal output from the third local oscillator;

a first mixer for mixing the phase-delayed signal output from the third local oscillator with the signal amplified by the IF amplifier, a second mixer for mixing the output signal of the third local oscillator with the signal amplified by the IF amplifier;

first and second low pass filters (LPFs) for eliminating high-frequency components, excluding a bit-frequency, from the respective outputs of the first and second mixers;

first and second analog-to-digital (A/D) converters for sampling the output signals of the first and second LPFs in a symbol frequency;

first and second National Television System Committee (NTSC) carrier eliminating filters for eliminating interference of NTSC adjacent channels from the digital data A/D converted and sampled by the first and second A/D converters;

a finite impulse response (FIR) LPF for changing the frequency of the digital signal output from the first NTSC carrier eliminating filter into a phase and eliminating high-frequency components thereof;

delay means for delaying the high-frequency-component-eliminated signal by a predetermined width so that changes to its frequency-versus-phase characteristics are linear;

symbol inverter means for inverting a symbol of the digital signal output from the second NTSC carrier eliminating filter;

a multiplexer (MUX) for selectively outputting the symbol-inverted signal and the digital signal output from the second NTSC carrier eliminating filter depending on the delayed signal;

a digital-to-analog (D/A) converter for converting the digital signal output from the MUX into an analog signal; and an automatic phase control (APC) LPF for eliminating high-frequency components of the output signal of the converted analog signal and limiting the band of the signal.

15. A digital frequency phases locked loop (FPLL) for a vestigial sideband (VSB) transmission system having a voltage-controlled oscillator, a third local oscillator and an intermediate frequency (IF) amplifier, comprising:

a phase delay means for delaying by 90° a phase of a center frequency signal output from the third local oscillator;

a first mixer for mixing the phase-delayed signal output
from the third local oscillator with the signal amplified
by the IF amplifier;
a second mixer for mixing the output signal of the third
local oscillator with the signal amplified by the IF
amplifier;
first and second low pass filters (LPFs) for eliminating
high-frequency components, excluding a bit-frequency,
from the respective outputs of the first and second
mixers;
first and second analog-to-digital (A/D) converters for
sampling the output signals of the first and second LPFs
in a symbol frequency;
first and second National Television System Committee
(NTSC) carrier eliminating filters for eliminating interference of NTSC adjacent channels from digital data
A/D converted and sampled by the first and second A/D
converters;
a finite impulse response (FIR) LPF for changing the
frequency of the digital signal output from the first
NTSC carrier eliminating filter into a phase and eliminating high-frequency components thereof;
delay means for delaying the high-frequency-componenteliminated signal by a predetermined width so that
changes to its frequency-versus-phase characteristics
are linear;
symbol inverter means for inverting a symbol of the
digital signal output from the second NTSC carrier
eliminating filter;
a multiplexer (MUX) for selectively outputting the
symbol-inverted signal and the digital signal output
from the second NTSC carrier eliminating filter
depending on the delayed signal;
a pulse width modulator for performing pulse width
modulation to the output of the multiplexer with a basic
pulse width of a symbol frequency; and
an automatic phase control (APC) LPF for eliminating
high-frequency components of the output signal of the
modulated signal and limiting the band of the signal.

16. A digital frequency phase locked loop (FPLL) for a vestigial sideband (VSB) transmission system having a voltage controlled oscillator (VCO) and a plurality of analog-to-digital (A/D) converters, comprising:
first and second filtering means for eliminating interference of National Television System Committee
(NTSC) adjacent channels of digital data output from
the respective plurality of A/D converters and sampled
in a symbol frequency, and for eliminating effects of the
data's phase characteristics;
symbol inverting means for inverting a symbol of the
signal output from the second filtering means;
delaying means for delaying the signal output from the
first filtering means by a predetermined width;
switching means for selectively outputting the digital
signal output from the symbol inverting means and the
signal output from the second filtering means depending on the signal output from the delaying means;
digital-to-analog (D/A) converting means for converting
the digital signal selectively output from the switching
means into an analog signal; and
third filtering means for eliminating high-frequency components of the analog signal output from the D/A
converting means to control the VCO.

17. The digital FPLL for a VSB transmission system according to claim 16, wherein the first and second filtering means are infinite impulse response (IIR) low pass filters (LPFs).

18. The digital FPLL for a VSB transmission system according to claim 16, wherein the switching means is a multiplexer.

19. The digital FPLL for a VSB transmission system according to claim 16, wherein the third filtering means is an LPF.

20. A digital frequency phase locked loop (FPLL) for a vestigial side band (VSB) transmission system having a voltage controlled oscillator (VCO) and third local oscillator and an intermediate frequency (IF) amplifier, comprising:
a phase delay means for delaying by 90° a phase of a
center frequency signal output from the third local
oscillator;
a first mixer for mixing the phase-delayed signal output
from the third local oscillator with a signal amplified by
the IF amplifier;
a second mixer for mixing the output signal of the third
local oscillator with the signal amplified by the IF
amplifier;
first and second low pass filters (LPFs) for eliminating
high-frequency components, excluding a bit-frequency,
from the respective outputs of the first and second
mixers;
first and second analog-to-digital (A/D) converters for
sampling the output signals of the first and second LPFs
in a symbol frequency;
first and second infinite impulse response (IIR) LPFs for
eliminating interference of National Television System
Committee (NTSC) adjacent channels from the digital
data sampled by the first and second A/D converters
and eliminating effects due to the interference for
intrinsic phase characteristics;
a symbol inverter for inverting a symbol of the digital
signal output from the second IIR LPF;
a delay means for delaying the signal output from the first
IIR LPF by a predetermined width;
a multiplexer (MUX) for selectively outputting signals
output from the symbol inverter and second IIR LPF
depending on the delayed signal;
a digital-to-analog (D/A) converter for converting the
digital signal selectively output from the multiplexer
into an analog signal; and
an LPF for eliminating high-frequency components of the
analog signal output from the D/A converter to control
the VCO.

21. A digital frequency phone locked loop (FPLL) for a vestigial sideband (VSB) transmission system having a voltage controlled oscillator (VCO) and a plurality of analog-to-digital (A/D) converters, comprising:
first filtering means for changing into a phase frequency
of digital signal outputs from the respective plurality of
A/D converters and sampled in a symbol frequency;
symbol inverting means for inverting a symbol of the
signal output from a first converter of the plurality of
A/D converters;
switching means for selectively outputting the signal
output from the first converter and the symbol-inverted
signal according to the signal output from the first
filtering means;
digital-to-analog (D/A) converting means for converting
the digital signal output from the switching means into
an analog signal; and
second filtering means for eliminating high-frequency
components of the analog signal output the D/A converting means to control the VCO.

22. The digital FPLL for a VSB transmission system according to claim 21, wherein the first filtering means is a 2-Tap infinite impulse response (IIR) low pass filter (LPF).

23. The digital FPLL for a VSB transmission system according to claim 21, wherein the switching means is a multiplexer.

24. The digital FPLL for a VSB transmission system according to claim 21, wherein the second filtering means is a LPF.

25. A digital frequency phase locked loop (FPLL) for a vestigial side band (VSB) transmission system having a voltage controlled oscillator (VCO), a third local oscillator and an intermediate frequency (IF) amplifier, comprising:

- a phase delay means for delaying by 90° a phase of a center frequency output from the third local oscillator;
- a first mixer for mixing the phase-delayed signal output from the third local oscillator with a signal amplified by the amplifier;
- a second mixer for mixing the output signal of the third local oscillator with the signal amplified by the IF amplifier;
- first and second low pass filters (LPFs) for eliminating high-frequency components, excluding the bit-frequency, from the respective outputs of the first and second mixers;
- first and second analog-to-digital (A/D) converters for sampling the output signals of the first and second LPFs in a symbol frequency;
- a symbol inverter for inverting the symbol of the digital signal output from the second A/D converter;
- a 2-Tap infinite impulse response (IIR) LPF for converting the frequency of the digital signal output from the first A/D converter into a phase;
- a multiplexer (MUX) for selectively outputting the digital signal output from the symbol inverter and the signal output from the second A/D converter depending on the 2-Tap IIR LPF;
- a digital-to-analog (D/A) converter for converting the digital signal selectively output from the multiplexer into an analog signal; and
- an LPF for eliminating high-frequency components of the analog signal output from the D/A converter to control the VCO.

\* \* \* \* \*